US008389199B2

(12) United States Patent
Rondon

(10) Patent No.: US 8,389,199 B2
(45) Date of Patent: Mar. 5, 2013

(54) LITHOGRAPHIC IMAGING WITH PRINTING MEMBERS HAVING METAL IMAGING BILAYERS

(75) Inventor: Sonia Rondon, Nashua, NH (US)

(73) Assignee: Presstek, Inc., Hudson, NH (US)

( * ) Notice: Subject to any disclaimer, the term of this patent is extended or adjusted under 35 U.S.C. 154(b) by 675 days.

(21) Appl. No.: 12/405,732

(22) Filed: Mar. 17, 2009

(65) Prior Publication Data

US 2010/0239976 A1 Sep. 23, 2010

(51) Int. Cl.
*G03F 7/00* (2006.01)
*B41N 1/00* (2006.01)

(52) U.S. Cl. .................... 430/270.1; 101/453; 101/463.1

(58) Field of Classification Search ............... 430/270.1, 430/302; 101/450.1, 453, 463.1
See application file for complete search history.

(56) References Cited

U.S. PATENT DOCUMENTS 3,650,743 A * 3/1972 Hallman et al. .............. 430/302
5,339,737 A 8/1994 Lewis et al.
5,487,338 A 1/1996 Lewis et al.
5,786,090 A 7/1998 Fisher et al.
6,045,964 A * 4/2000 Ellis et al. ..................... 430/200
6,484,637 B2 11/2002 Lewis
7,078,152 B2 * 7/2006 Rondon et al. ............. 430/271.1
7,205,091 B2 4/2007 Cassidy
7,351,517 B2 * 4/2008 Rondon ..................... 430/276.1
2006/0037505 A1 2/2006 Bieber et al.
2006/0048656 A1 3/2006 Bieber et al.
2006/0130690 A1 6/2006 Bieber
2006/0234162 A1 10/2006 Rondon
2007/0039502 A1 2/2007 Bieber et al.
2007/0196578 A1 8/2007 Karp et al.
2009/0123871 A1 * 5/2009 Rondon et al. ................ 430/302

FOREIGN PATENT DOCUMENTS

WO WO-97/31774 A1 9/1997
WO WO 97/31774 A1 * 9/1997

OTHER PUBLICATIONS http://refractiveindex.info/?group=METALS&material=Aluminium (2011).*
http://www.optoscience.com/maker/linos/pdf/Catalog_EN_10_11/18-Thin%20Film%20Coatings.pdf (2011).*
http://www.engineeringtoolbox.com/melting-temperature-metals-d_860.html (2011).*
www.wikepedia.org/copper or zin.*
Extended European Search Report for EP10250457.8 (issued Jul. 12, 2010).

* cited by examiner

*Primary Examiner* — Cynthia H Kelly
*Assistant Examiner* — Chanceity Robinson
(74) *Attorney, Agent, or Firm* — Bingham McCutchen LLP

(57) ABSTRACT

Printing members include very thin metal imaging bilayers that combine to trap and utilize imaging radiation and, due to their minimal thicknesses, ablate easily. The bilayer may include a first (bottommost) metal layer having a high extinction coefficient in the imaging wavelength range (e.g., 600-1200 nm) and, thereover, a second metal layer having a high transmittance and low emissivity for imaging radiation.

16 Claims, 2 Drawing Sheets

LITHOGRAPHIC IMAGING WITH PRINTING MEMBERS HAVING METAL IMAGING BILAYERS

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the wetted printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers.

Current laser-based lithographic systems generally rely on removal of an energy-absorbing layer from the lithographic plate to create an image. Exposure to laser radiation may, for example, cause ablation—i.e., catastrophic overheating—of the ablated layer in order to facilitate its removal. Accordingly, the laser pulse must transfer sufficient energy to the absorbing layer, leading to a trade-off between, on one hand, imaging speed and laser power, and on the other hand, layer thickness and radiation absorption. Low laser power levels and high imaging speeds are highly desirable for commercial applications. But the more these parameters are emphasized, the thinner and more absorptive the imaging layer must be. The imaging layer must also exhibit adequate adhesion to adjacent layers. Conventional imaging layers are applied at thicknesses that limit achievable increases in imaging speed and reduction of laser power requirements. Obtaining imaging layers that are thinner and more absorptive than conventional layers, while retaining adequate adhesion to adjacent layers, represents a challenging problem.

SUMMARY OF THE INVENTION

Embodiments of the present invention involve printing members that include very thin metal imaging bilayers. In general, the bilayer may include a first (bottommost) metal layer having a high extinction coefficient in the imaging wavelength range (e.g., 600-1200 nm) and, thereover, a second metal layer having a high transmittance and low emissivity for imaging radiation. These layers combine to trap and utilize imaging radiation and, due to their minimal thicknesses, ablate easily. The ability to utilize ultrathin layers derives from the complementary functions each performs; the result is not only high conversion efficiency but low material costs for the bilayer.

Accordingly, in a first aspect, the invention relates to a printing member comprising a polymeric substrate and, disposed over the substrate, first and second radiation-responsive layers each having a thickness below an optical penetration depth thereof for near-IR radiation. In various embodiments, the first radiation-responsive layer consists essentially of a metal having a coefficient of extinction of at least 3 in a wavelength range of 600-1200 nm, and the second radiation-responsive layer consists essentially of a metal having a transmittance of at least 30% in a wavelength range of 600-1200 nm. The phrase "consists essentially of" means that the active component in the layer is the metal or metal mixture, but it is understood that processing may introduce impurities or metal oxides (at levels ranging from 10-25%, for example) into the layer. Such layers nonetheless "consist essentially of" the metal or metal mixture.

A topmost layer is disposed over the first and second radiation-responsive layers; the topmost layer and the substrate have opposite affinities for at least one of ink or a liquid to which ink will not adhere.

In various embodiments, the second radiation-responsive layer overlies the first radiation-responsive layer. Both radiation-responsive layers desirably have melting points below 1100° C., and the second radiation-responsive layer preferably has a melting point below 500° C. Whereas the substrate may scatter imaging radiation, the second radiation-responsive layer can be selected to reflect it. In various embodiments, the first radiation-responsive layer consists essentially of at least one of aluminum, copper, silver or gold, and the second radiation-responsive layer consists essentially of at least one of tin, zinc, indium or gallium. The first radiation-responsive layer may have a thickness ranging from 8 to 16 nm, e.g., 12 nm; and the second radiation-responsive layer may have a thickness ranging from 4 to 8 nm, e.g., 5 nm. The first and second radiation-responsive layers may have a combined thickness ranging from 12 to 24 nm.

In some embodiments, the substrate is oleophilic and the topmost layer is polymeric and oleophobic. For example, the substrate may be polyester and the topmost layer may be silicone. In other embodiments, the substrate is oleophilic and the topmost layer is polymeric and hydrophilic. For example, the substrate may polyester and the topmost layer may be polyvinyl alcohol.

In another aspect, the invention relates to a method of imaging a printing member. In various embodiments, the printing member comprises a polymeric substrate and, disposed over the substrate, first and second radiation-responsive layers each having a thickness below an optical penetration depth thereof for imaging radiation. In various embodiments, the first radiation-responsive layer consists essentially of a metal having a coefficient of extinction of at least 3 in a wavelength range of 600-1200 nm, and the second radiation-responsive layer consists essentially of a metal having a transmittance of at least 30% in a wavelength range of 600-1200 nm. A topmost layer is disposed over the first and second radiation-responsive layers; the topmost layer and the substrate have opposite affinities for at least one of ink or a liquid to which ink will not adhere.

The method includes exposing the printing member to imaging radiation in an imagewise pattern. The imaging radiation is absorbed by the imaging layers where exposed. Then, the first layer is removed where the printing member received imaging radiation, creating an imagewise pattern on the printing member.

It should be stressed that, as used herein, the term "plate" or "member" refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

DESCRIPTION OF DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

1. Imaging Apparatus

Figure 1:
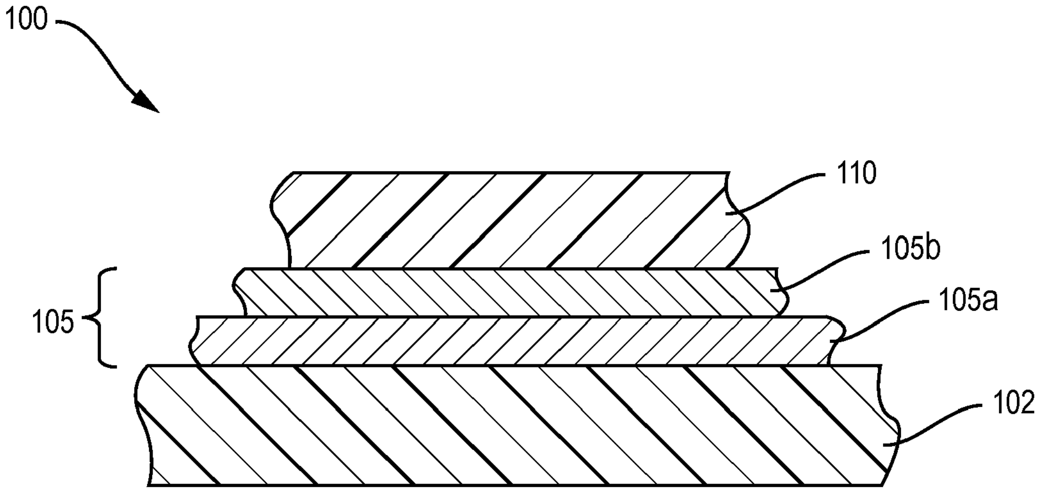
FIG. 1 is an enlarged cross-sectional view of a negative-working printing member according to the invention.

An imaging apparatus suitable for use in conjunction with the present printing members includes at least one laser device that emits in the region of maximum plate responsiveness, i.e., whose $\lambda_{max}$ closely approximates the wavelength region where the plate absorbs most strongly. Specifications for lasers that emit in the near infrared (IR) region are fully described in U.S. Pat. No. Re. 35,512 ("the '512 patent") and U.S. Pat. No. 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861,992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam. Examples of useful imaging devices include models of the TRENDSETTER imagesetters (available from Eastman Kodak Company) that utilize laser diodes emitting near-IR radiation at a wavelength of about 830 nm. Other suitable exposure units include the CRESCENT 42T Platesetter (operating at a wavelength of 1064 nm, available from Gerber Scientific, Chicago, Ill.) and the SCREEN PLATERITE 4300 series or 8600 series plate-setter (available from Screen, Chicago, Ill.).

Regardless of the manner in which the beam is scanned, in an array-type system for on-press applications it is generally preferable to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

2. Lithographic Printing Members

FIG. 1 illustrates a negative-working printing member 100 according to the invention that includes a substrate 102, a bilayer 105 including or consisting essentially of a pair of radiation-responsive layers 105*a*, 105*b*, and a topmost layer 110. Layers 105*a*, 105*b* are sensitive to imaging (generally IR) radiation as discussed below, and imaging of the printing member 100 (by exposure to IR radiation) results in ablation of layers 105*a*, 105*b*. The resulting de-anchorage of topmost layer 110 facilitates its removal by rubbing or simply as a result of contact during the print "make ready" process. Substrate 102 (or a layer thereover) exhibits a lithographic affinity opposite that of topmost layer 110. Consequently, ablation of layers 105*a*, 105*b*, followed by imagewise removal of the topmost layer 110 to reveal an underlying layer or the substrate 102, results in a lithographic image.

Most of the films used in the present invention are continuous. The term "continuous" as used herein means that the underlying surface is completely covered with a uniform layer of the deposited material. However, in various embodiments, the topmost layer of the metal bilayer (layer 105*b* in FIG. 1) is non-continuous, taking the form of coarse metal grains that do not completely cover the surface of the underlying metal layer.

Each of these layers and their functions is described in detail below.

a. Substrate 102

The substrate provides dimensionally stable mechanical support to the printing member. The substrate should be strong, stable, and flexible. One or more surfaces (and, in some cases, bulk components) of the substrate may be hydrophilic. The topmost surface, however, is generally oleophilic. Suitable materials include, but are not limited to, polymers, metals and paper, but generally, it is preferred to have a polymeric ink-accepting layer (e.g., applied over a metal or paper support). As used herein, the term "substrate" refers generically to the ink-accepting layer beneath the radiation-sensitive layers 105*a*, 105*b*, although the substrate may, in fact, include multiple layers (e.g., an oleophilic film laminated to a metal support, or an oleophilic coating over a paper support).

Substrate 102 desirably also exhibits high scattering with respect to imaging radiation. This allows full utilization of the radiation transmitted through overlying layers, as the scattering causes back-reflection into bilayer 105 and consequent increases in thermal efficiency.

Polymers suitable for use in substrates according to the invention include, but are not limited to, polyesters (e.g., polyethylene terephthalate and polyethylene naphthalate), polycarbonates, polyurethane, acrylic polymers, polyamide polymers, phenolic polymers, polysulfones, polystyrene, and cellulose acetate. A preferred polymeric substrate is polyethylene terephthalate film, such as the polyester films available from DuPont-Teijin Films, Hopewell, Va. under the trademarks MYLAR and MELINEX, for example. Also suitable are the white polyester products from DuPont-Teijin such as MELINEX 927W, 928W 329, 329S, 331.

Polymeric substrates can be coated with a hard polymer transition layer to improve the mechanical strength and durability of the substrate and/or to alter the hydrophilicity or oleophilicity of the surface of the substrate. Ultraviolet or electron-beam cured acrylate coatings, for example, are suitable for this purpose. Polymeric substrates can have thicknesses ranging from about 50 μm to about 500 μm or more, depending on the specific printing member application. For printing members in the form of rolls, thicknesses of about 200 μm are preferred. For printing members that include transition layers, polymer substrates having thicknesses of about 50 μm to about 100 μm are preferred.

b. Bilayer 105

The bilayer 105 may include a first (bottommost) metal layer 105*a* having a high extinction coefficient in the imaging wavelength range (e.g., 600-1200 nm) and, thereover, a second metal layer 105*b* having a high transmittance and low emissivity for imaging radiation. In general, layers 105*a*, 105*b* are ultrathin, semitransparent metal films, and may be prepared using physical vapor deposition methods (PVD) such as magnetron sputtering deposition, thermal evaporation, or laser vapor deposition. The metals typically exhibit a low melting point (<1100° C.), high thermal-expansion coefficient coefficients, high thermal conductance, and good adhesion to each other and, desirably, to overlying and underlying layers. Thermal-expansion coefficients are preferably at least $14\times10^{-6}$/K and may be in the range $(14-32)\times10^{-6}$/K. Thermal conductivity (measured at 20° C.) is preferably at least 40 W/m·K, and may be in the range of 40 W/m·K to 430 W/m·K.

In various embodiments, radiation-responsive layers 105*a*, 105*b* have thicknesses below their optical penetration depth (e.g., below 15 nm). The bottommost layer 105*a* is generally the primary absorber of imaging radiation, and therefore has a high extinction coefficient in the wavelength band—typically 600-1200 nm—of interest. The extinction coefficient, k, for a particular substance is a measure of how well it scatters and absorbs radiation of a given wavelength. A low extinction coefficient (k<1) means that the radiation can pass through very easily, while a very high extinction coefficient means that the radiation hardly penetrates the material at all, becoming "extinct" within the layer. In general, layer 105*a* has an extinction coefficient of at least 3 (i.e., $k\geqq3$) throughout the wavelength range 600-1200 nm.

Preferred IR-absorbing metals for layer 105*a* include aluminum, copper, silver, or gold, as well as mixtures and alloys thereof. One embodiment uses an ultrathin semitransparent aluminum film. The semitransparency limits the amount of near-IR radiation this layer can absorb and, therefore, its thermal efficiency. But at thicknesses larger than the optical penetration depth, a fully opaque layer would exhibit extremely high specular (mirror) reflectance. Layer 105*a* may therefore have a thickness ranging from 8 to 16 nm, e.g., 12 nm.

Thermal efficiency is improved by using the second (and typically overlying) radiation-responsive layer 105*b*. The layer 105*b* exhibits a transmittance of at least 30% in the wavelength range of 600-1200 nm, and desirably a low emissivity in this range. The high transmittance minimizes the loss of imaging radiation due to reflection at the surface of the layer 105*a* and backscattering by the substrate 102 of radiation that has penetrated layer 105*b*. Preferred metals for radiation-responsive layer 105*b* include at least one of tin, zinc, indium or gallium, as well as mixtures and alloys thereof. Layer 105*b* may have a thickness ranging from 4 to 8 nm, e.g., 5 nm, and the combined thickness of bilayer 105 may range from 12 to 24 nm.

Figure 2:
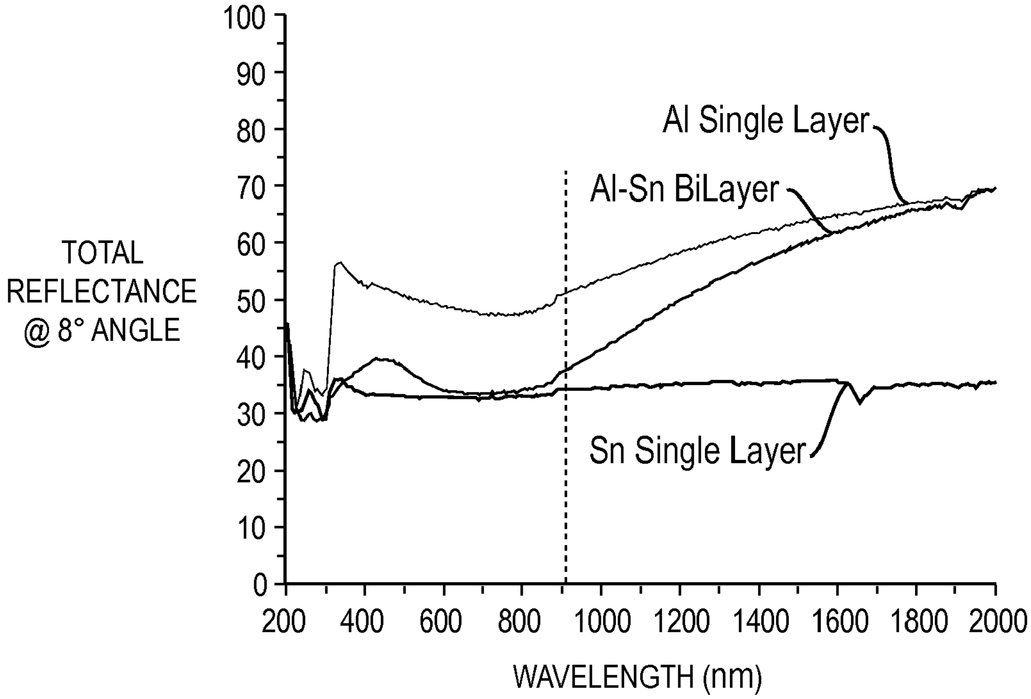
FIG. 2 graphically compares the total reflectance spectra (200 nm-2000 nm range) of single layers to a bilayer structure in accordance with the invention.

FIG. 2 shows a comparison of the total reflectance spectra (200 nm-2000 nm range) between single layers (Sn and Al) and a bilayer Al/Sn structure in accordance herewith. The effect of adding a tin layer over the aluminum layer is the reduction of the radiation lost by reflection in the wavelength range 600-1000 nm.

While both radiation-responsive layers 105 desirably have melting points below 1100° C., the radiation-responsive layer 105*b* preferably has a melting point below 500° C. This ensures a faster thermal response. In this regard, low enthalpy of melting and vaporization are desirable characteristics for layer 105*b* as well. Furthermore, whereas the substrate 102 desirably scatters imaging radiation, the layer 105*b* can be selected to reflect it. This, once again, enhances thermal efficiency by increasing radiation absorption in layer 105*a*.

Layers 105*a*, 105*b* may also be selected for adhesion to substrate 102 (in the case of layer 105*a*) and to topmost layer 110 (in the case of layer 105*b*). For example, tin and aluminum layers alone and in an Al/Sn bilayer structure 105 are rich in surface hydroxyl groups that act as bonding sites and promote adhesion to topmost layer 110. In the case of a silicone top layer 110, silicone molecules may attach to the surface of layer 105*b* via two mechanisms: mechanical interlocking and chemical reaction. The latter provides long-term stability through formation of silyl-ether linkages, M-O—Si—, at the metal-polymer interface. It is expected that plate members based on these metal layers will therefore exhibit high stability and durability.

c. Topmost Layer 110

The topmost layer participates in printing and provides the requisite lithographic affinity difference with respect to substrate 102. In addition, the topmost layer may help to control the imaging process by modifying the heat dissipation characteristics of the printing member at the air-imaging layer interface. Negative-working printing members may include a hydrophilic protective layer disposed over the topmost layer 110 to protect the surface of the imaging layer against contamination due to exposure to air and damage during plate handling. The topmost layer remains bonded to the imaging layer and interacts with the water component of the fountain solution as the non-image surfaces of the lithographic printing member.

In wet-plate embodiments, suitable materials for topmost layers 110 include hydrophilic polymers, such as polyalkyl ethers, polyhydroxyl compounds, and polycarboxylic acids, or oleo. For example, a hydrophilic topmost layer may include a fully hydrolyzed polyvinyl alcohol (e.g., Celvol 305, 325 and 425 sold by Celanese Chemicals, Ltd. Dallas, Tex.), which are usually manufactured by hydrolysis of polyvinyl acetates. The use of fully hydrolyzed alcohol is preferred to assure that residual non-hydrolyzed acetate does not affect the hydrophilic behavior of the surface. The presence of residual polyvinyl acetate moieties in the topmost layer promotes interaction of the non-image areas of the printing member with printing inks, which can diminish print quality.

Topmost layers are typically applied between 0.05 and 2.5 g/m$^2$ using coating techniques known in the art, such as wire-wound rod coating, reverse roll coating, gravure coating, or slot die coating. For example, in particular embodiments, the topmost layer is applied using a wire-round rod, followed by drying in a convection oven. In various embodiments, the topmost layer is applied between 0.2 and 2.5 g/m$^2$, e.g., 1.0 to 2.0 g/m$^2$. In one embodiment, the topmost layer is applied between 0.2 and 0.9 g/m$^2$ to create a process-free printing member. Applications from 1.0 to 2.5 g/m$^2$ create a more durable printing member, but these generally require a mild processing such as water rinse and wipe prior to press use.

The topmost layer can also include hydrophilic plasma polymer films deposited by vacuum coating techniques, as discussed above. Such topmost layers may also be applied by plasma polymerization of gas mixtures that produce polymer films with polar functional groups. For example, a topmost layer may applied using plasmas of reactive gas mixtures (e.g., oxygen, carbon dioxide, nitrogen, and/or nitrogen oxide mixed with hydrocarbon gases), or using hydrocarbons containing oxygen functional groups.

The durability of the topmost layer is preferably enhanced by the use of an inorganic crosslinker, e.g., ammonium zirconium carbonate. In order to ensure a high degree of crosslinking (and thus, a high resistance to water), high concentrations (e.g., 10-20%) of the crosslinker are preferred. A suitable crosslinker is BACOTE 20, sold by MEL Chemicals, Manchester, UK. The exposed top surface of the crosslinked topmost layer preferably contains little or no residual inorganic crosslinker, such that the topmost layer remains hydrophilic. The use of an inorganic crosslinker rather than an organic crosslinker (e.g., aldehyde) lessens or eliminates VOC emission due to thermal decomposition during the imaging process. However, organic crosslinkers can be used if desired. Suitable crosslinkers include dialdehydes (e.g., the GLYOXAL product sold by Clariant Fine Chemicals, Charlotte, N.C.), melamine formaldehyde (e.g., the CYMEL 303 product sold by Citek), or polyamide epichlorohydrin (e.g., the POLYCUP 172 product sold by Hercules). The GLYOXAL crosslinker is especially preferred, providing acceptable reduction of solubility at concentration levels of 10% to 20% of solids in the formulation.

The crosslinked topmost layer is not water-soluble, and thus is not fully removed during printing runs. As such, the topmost layer contributes to the mechanical stability of the printing member, enabling the use of an imaging layer comprising a high percentage of metal or consisting essentially of metal. A high ceramic content in the imaging layer, normally required to maximize mechanical stability, is thus not required. Moreover, in various embodiments, transition layer 104, normally present to contribute mechanical stability, is not required in the printing member. In contrast, existing topmost layers without inorganic crosslinkers display only limited water resistance and are unsuitable for use on printing members not incorporating ceramic imaging layers.

In preferred embodiments, the durability and surface lubricity of the topmost layer is improved by the incorporation of a surfactant. In negative-working embodiments, which feature a hydrophilic topmost layer 110, the surfactant is preferably a silicone compound having polar substituents, e.g., polyether-modified polydimethylsiloxane. A high concentration (e.g., approximately 5% to approximately 25% of the solid components of the topmost layer) of the surfactant is generally added to the topmost layer formulation in order to ensure adequate lubrication during use. In a specific embodiment, the concentration of the surfactant is approximately 10%. The high concentration of the surfactant ensures that an adequate amount of the surfactant will appear at the exposed surface of the topmost layer 110, and the polar moieties prevent the surfactant from adversely affecting the hydrophilicity of the layer. If the concentration of surfactant is too low (e.g., less than approximately 4-5%), the molecules thereof at the exposed surface of the topmost layer may be easily removed by immersion in water and/or mechanical wiping of the surface.

For negative-working printing members, suitable surfactants are compatible with water in addition to providing enhanced surface lubricity to the topmost layer. For silicone surfactants modified with polyether chains, water compatibility is facilitated by a high percentage (e.g., approximately 55% to approximately 70%) of ethylene oxide (EO) groups relative to propylene oxide (PO) groups in the polyether chain of the surfactant molecule. Enhanced surface lubricity is facilitated by the presence of relatively long methylsiloxane chains, e.g., such that the total molecular weight of the surfactant is approximately 2,000 to approximately 30,000 g/mol. Specific surfactants compatible with various embodiments of the invention include BYK 303, BYK 207, and BYK 333, all sold by BYK-Chemie GmbH, Wesel, Germany. The preferred surfactants are silicone polyethers with a water-insoluble silicone backbone.

The chemical structure of a suitable surfactant may reflect a compromise among various factors. The topmost hydrophilic layer is desirably disposed on the imaging layer using a low-VOC aqueous coating process. Therefore, the surfactant should exhibit good water compatibility to avoid complete separation during the coating process. This property depends largely on the molecular weight of the surfactant, but also can be tailored by altering the polarity of the surfactant molecule. A polyether chain, for example, includes hydrophilic EO groups and hydrophobic PO chains. The polarity of the silicone surfactant, and thus the water compatibility, is largely determined by the EO/PO ratio in the molecule; in particular, water-compatible silicone-based surfactants have a relatively high proportion of EO. Preferred molecular structures have a total percentage of EO-PO chains of 50% to 70% percent, of which 35% to 55% is preferably hydrophilic EO. Excesive EO content can render the surfactant too soluble, which can reduce the driving force to bring it to the surface of the dry coating during the drying step. For lubrication, on the other hand, adequate performance can be obtained with a relatively large number of dimethylsiloxy segments, although a minimum number of dimethylsiloxane units is required to get the slip effect at the surface of the coating. Therefore, relatively long siloxane chains (i.e., high molecular weights) are desirable; such chains also advantageously enhance migration to the surface of the final coating during drying. In general, the surface slip effect increases, while water compatibility and wetting decrease, as a function of molecular weight. Suitable surfactants are straightforwardly selected without undue experimentation to obtain the desired combination of slip and water interaction.

The topmost layer formulation (i.e., including the inorganic crosslinker and surfactant) is preferably dried and cured at a relatively high temperature, e.g., approximately 350° F. to approximately 375° F. (or approximately 160° C. to approximately 190° C.), in order to ensure approximately complete crosslinking. Moreover, at the high curing temperature, the polyether-modified silicone surfactant molecules become an integral part of the topmost layer (the polyether chains oxidize at temperatures of 140° C.-150° C. or 280° F.-300° F.), and resist detachment in a commercial printing environment. Such detachment would reduce surface lubricity. Without wishing to be bound by any particular theory or mechanism, it is theorized that, at high curing temperatures, the methoxy groups of the surfactant are oxidized and become sites reactive with the remaining (e.g., polyvinyl alcohol) matrix.

In dry-plate embodiments, suitable materials for topmost layer 110 include silicone polymers, fluoropolymers, and fluoro-silicone polymers. Silicone polymers are based on the repeating diorganosiloxane unit $(R_2SiO)_n$, where R is an organic radical or hydrogen and n denotes the number of units in the polymer chain. Fluorosilicone polymers are a particular type of silicone polymer wherein at least a portion of the R groups contain one or more fluorine atoms. The physical properties of a particular silicone polymer depend upon the length of its polymer chain, the nature of its R groups, and the terminal groups on the end of its polymer chain. Any suitable silicone polymer known in the art may be incorporated into or used for the surface layer 110.

Silicone polymers are typically prepared by cross-linking (or "curing") diorganosiloxane units to form polymer chains. The resulting silicone polymers can be linear or branched. A number of curing techniques are well known in the art, including condensation curing, addition curing, moisture curing. In addition, silicone polymers can include one or more additives, such as adhesion modifiers, rheology modifiers, colorants, and radiation-absorbing pigments, for example. Other options include silicone acrylate monomers, i.e., modified silicone molecules that incorporate "free radical" reactive acrylate groups or "cationic acid" reactive epoxy groups along and/or at the ends of the silicone polymer backbone. These are cured by exposure to ultraviolet (UV) and electron radiation sources. This type of silicone polymer can also include additives such as adhesion promoters, acrylate diluents, and multifunctional acrylate monomer to promote abrasion resistance, for example.

Examples of suitable fluoropolymers include polytetrafluoroethylene (PTFE), perfluoroalkoxy (PFA), fluorinated ethylene propylene (FEP), ethylene tetrafluoroethylene (ETFE), polytetrafluoroethylene perfluoromethylvinylether (MFA), or tetrafluoroethylene hexafluoropropylene vinylidene (THV). Any suitable fluoropolymer known in the art may be incorporated into or used for the surface layer 110.

3. Imaging Techniques

Figure 3B:
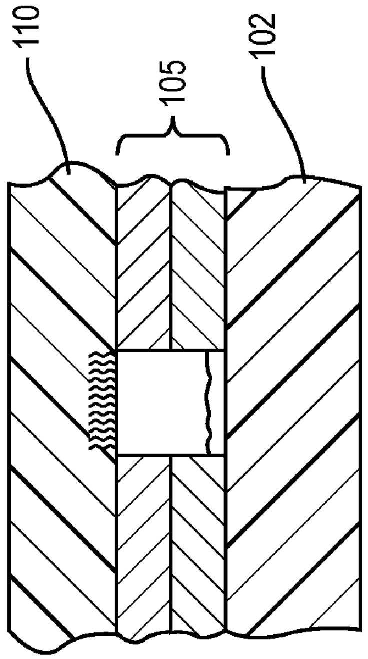
FIGS. 3A and 3B illustrate the effect of imaging the printing member illustrated in FIG. 1.
Figure 3A:
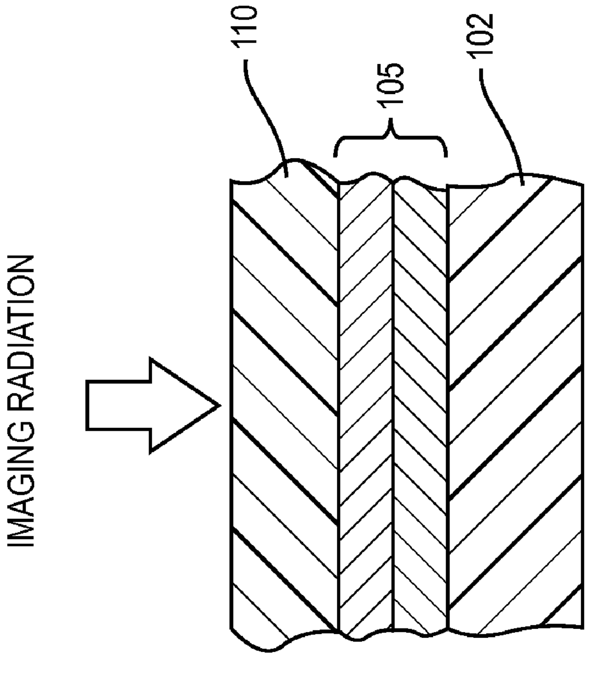

FIGS. 3A and 3B show the consequences of imaging the printing member illustrated in FIG. 1. The printing member may include an oleophilic substrate 102, a metal bilayer 105, and a hydrophilic or oleophobic topmost layer 110. As illustrated in FIG. 3A, the exposed area of the bilayer 105 absorbs the imaging pulse and converts it to heat. The heat diffuses through the bilayer and builds up until the bilayer 105 ablates, i.e., undergoes either rapid phase transformation (e.g., vaporization) or catastrophic thermal overload. This process is mainly attributed to the contribution of an explosive mechanism generated in the image areas of the plate by exposure to laser radiation.

After imaging, the topmost layer 110 is degraded and/or de-anchored in the areas that received imaging radiation. The exposed areas that contain ablation debris are either purged of the debris prior to printing or during print "make ready." In some embodiments, the printing member can be used on press immediately after being imaged without the need for a post-imaging processing step.

Printing with the printing member includes disposing ink on at least a portion of the printing member, preferably the oleophilic exposed areas. The ink is transferred in the image-wise lithographic pattern (created as described above) to a recording medium such as paper. The inking and transferring steps may be repeated a desired number of times, e.g., the approximately 5,000 to approximately 20,000 times in a low to medium printing run.

EXAMPLES

Example 1

A dry printing member in accordance with the invention includes a polyester substrate having dispersed therein a highly scattering filler material (e.g., $BaSO_4$, $TiO_2$, etc.) at a loading level of 10% or less by weight. In this example, the substrate is a 200 μm polyethylene terephthalate film, sold by duPont—Teijin Films (Hopewell, Va.) under the trade name MELINEX 927W, which contains a dispersion of $BaSO_4$ particles and provides a highly scattering base; the first radiation-responsive layer 105*a* is Al; and the second (upper) layer radiation-responsive layer 105*b* is Sn.

Deposition of the Al and Sn layers is carried out in a DC magnetron sputtering source using ultrahigh purity argon as the sputtering gas. Prior to the metal deposition, the sputtering chamber is evacuated to base pressures below $3\times10^{-5}$ Torr and back-filled with argon up to a pressure of 5 mTorr. The Al and Sn layers are sequentially sputterred to yield layers of thicknesses 10 nm and 4 nm, respectively.

The semitransparent nature of the Al layer limits the amount of near-IR absorption, and therefore, the layer's thermal sensitivity. However, the ability to utilize thick aluminum layers is also limited due to the high specular/mirror reflectance of opaque aluminum films at thicknesses larger than its optical penetration depth. The limitations associated with a single aluminum layer are overcome by the addition of the Sn layer, which exhibits high transmittance and low emissivity in the near-IR, capturing IR radiation that would otherwise be lost due to reflection at the surface of the Al layer and back-scattering of transmitted radiation by the substrate.

The imaging sensitivity of the imaging member was evaluated upon exposure to near-IR laser radiation in the range 800-1200 nm. The radiation-responsive layers absorb radiation and quickly convert it into heat which, in turn, causes melt/vaporization at the metal-polymer interface, leading to ablation of the first and second imaging-response layers. The ablated metal forms fine debris that is easily removed from polymer substrate. No major sign of polymer damage was observed on the exposed polymer areas. The printing member images efficiently on different imaging setters, e.g., Presstek's DIMENSION 400 and DIMENSION 425, and the Kodak TRENDSETTER (Eastman Kodak Company). For example, the power requirement on the TRENDSETTER device is in the order of 140 mJ/cm$^2$.

The Al/Sn radiation-responsive layers may be used in the construction of printing members with enhanced durability. This depends most strongly on the adhesion of polymer layers disposed on the radiation-responsive layers. The interaction of the metal surfaces with other molecules, such as polymer, is dictated by the surface composition of the metal. The surfaces of metal films, such an Al/Sn bilayer, oxidize quickly and react with oxygen present in the atmosphere almost instantaneously, forming oxide layers that are terminated by a near-monolayer of hydroxides. This is a well-known, thermodynamically driven process that minimizes surface energy. Furthermore, it is well known that the terminal layer of hydroxyl groups formed on oxidized metal surfaces act as bonding sites for the adhesion of oxygen-containing polymer layers through the formation of covalent M-O-X bonds. These processes enhance adhesion and, hence, durability. It is found that two-layer Al/Sn structures have high concentrations of hydroxyl groups on their surfaces, affording the ability to construct printing members with enhanced durability.

Example 2

This example describes a negative-working dry printing plate that includes a silicone layer disposed above the structure described in Example 1. The silicone layer has a highly crosslinked network structure produced by addition or hydrosilylation reaction between vinyl-functional silicones and a silicon hydride crosslinker. The silicone solutions used in this example are described below, but other suitable formulations are also given in previous patents, e.g., U.S. Pat. No. 5,212,048, the entire disclosure of which is hereby incorporated by reference.

| Component | Supplier | Parts |
|---|---|---|
| 165K & 10K Silicone | Nusil Silicone Technology, Charlotte, NC | 0.12 |
| DC Syl-off 7367 | Univar USA Inc., Atlante, GA | 8.55 |
| CPC072 | Umicore Precious Metals, S. Plainfield, NJ | 0.38 |
| Heptane | Houghton Chemicals, Allston, MA | 90.95 |

The coating solution is applied on the imaging member using a wire-wound rod, then dried and cured to produce a uniform silicone coating of 1.1 g/m$^2$. The printing plate is then ready for imaging. The plate was imaged on the Presstek DIMENSION 400 image setter to evaluate imaging performance. The imaging work includes determination of the depth of focus (DOF), and evaluation of power requirements by imaging at increasing power levels (25 mJ/cm$^2$ steps).

The plate has a DOF in the order of ±2 mm, and a power requirement for imaging of 290 mJ/cm$^2$. Upon imaging exposure with near-IR laser radiation in the range 800-1000 nm, the radiation-responsive layers absorb radiation and quickly convert it into heat which, in turn, causes melt/vaporization at the polymer-metal interface. This process destroys the bonding of the silicone to the imaging layer and allows easy removal of the loosened silicone layer in the laser-exposed areas by mechanical dry and wet cleaning. Removal of the silicone exposes the oleophilic polyester substrate, which becomes the image (ink-accepting) layer of the printing member. The unexposed, silicone-coated areas of the plate reject ink.

Other important performance parameters for printing plates are durability and environmental stability. These may be tested in the laboratory by evaluating adhesion (e.g., using the X-hatch-Adhesive test, which determines the removability of the silicone coating using adhesive tape) and solvent resistance (MEK and heptane rubs, e.g., determining the amount of silicone lost after applying 10 heptane rubs using a five-pound reciprocating load on a surface of about 20 cm length) of fresh plates stored at ambient conditions (room temperature and humidity), and plates aged in an environmental chamber at 80° C. and 75% relative humidity for 18 hours. The results of the test are summarized in the following table:

| Printing | Plates Stored at Standard Conditions | | | Aged Plates | |
|---|---|---|---|---|---|
| Member | X-hatch Test | MEK | Heptane | MEK | Heptane |
| Example 2 | Pass | 90-100 | Pass | 90-100 | Pass |

The laboratory tests show that the dry printing embodiment displays excellent wear and adhesion resistance, which is not affected by exposure to high temperature and humidity conditions. The results are further confirmed by on-press tests. In particular, the fresh and aged printing plates were imaged on the DIMENSION 400 plate setter and manually cleaned prior to press use. Subsequently, printing performance was evaluated on a Heidelberg GTO press using black ink and uncoated paper. Under these conditions, the fresh plate was run for more than 10,000 impressions with no signs of wear or scratch failure. Furthermore, the performance of the aged plate was comparable to that of the fresh plate for run lengths up to 10,000 impressions.

Example 3

This example is similar to Example 2 with radiation-responsive and oleophobic layers disposed on highly scattering polyester base and laminated to an aluminum coil. The structure described in Example 1 was constructed using the 50 μm Melinex 928W polyester substrate, and then coated with the 1.1 g/m$^2$ formulation used in Example 2. The coated structure was then laminated to a 150 μm coil of aluminum 3103 alloy lithographic metal (Alcoa, Pittsburgh, Pa.) using an acrylate adhesive supplied by Dyna-Tech Adhesives & Coatings, Grafton, W.Va. The acrylate adhesive is a 100% solids formulation cured with an e-beam radiation source.

The printing plate was evaluated for imaging and printing performance using the equipment and procedures described in Example 2. The plate exhibits imaging and press performance similar to that of the plate member of Example 2.

Example 4

This example describes a negative-working wet lithographic printing member based on the structure described in Example 1, and a topmost insoluble hydrophilic layer based on a fully hydrolyzed polyvinyl alcohol (PVA) polymer. The PVA layer in this example utilizes CELVOL 325 (sold by Celanese Chemicals, Ltd., Dallas, Tex.), whose solubility is considerably reduced by the crosslinking reaction between the functional hydrophilic groups of PVA and an inorganic crosslinking agent such as BACOTE 20 (sold by MEL Chemicals, Manchester, UK).

The formulation used to form the topmost hydrophilic layer (described in U.S. Ser. No. 11/937,869, the entire disclosure of which is hereby incorporated by reference) is given below:

| Component | Supplier | Parts |
|---|---|---|
| CELVOL 325 | Celanese Chemicals, Ltd. Dallas, TX | 2.5 |
| BACOTE 20 | MEL Chemicals, Manchester, UK | 0.78 |
| BYK333 | BYK-Chemie GmbH, Wesel, Germany | 0.60 |
| Glycerol | Sigma-Aldrich, Saint Louis, MO | 0.17 |
| Water | | 96 |

The solution is applied on the imaging member of FIG. 1 using a wire-wound rod, and then dried and cured to produce a solid coating of weight of 2 g/m$^2$. The plate images efficiently on different imaging setters, e.g., the Presstek DIMENSION 400 and DIMENSION 425, the Presstek VECTOR TX-52, and the Kodak TRENDSETTER.

Upon imaging exposure with near-IR laser radiation in the range 800-1000 nm, the radiation-responsive layers absorb radiation and quickly convert it into heat which, in turn, causes melt/vaporization at the polymer-metal interface. This process destroys the bonding of the topmost hydrophilic layer, and allows easy removal of the loosened polymer in the laser-exposed areas by wet cleaning. In this example, the polyester substrate exposed after imaging and cleaning accepts ink, while the topmost hydrophilic layer in unexposed areas accepts dampening fluid.

This wet printing member may be imaged on the Presstek Dim425 platesetter using a power level on the order of 250 mJ/cm$^2$. The loosened polymer debris left in the exposed areas of the plate is cleaned by mild rubbing with a water wet cotton towel. The imaged and cleaned plate was evaluated on a Heidelberg GTO press using black ink and uncoated paper. The plate ran for more than 10,000 impressions with no signs of wear or scratch failure.

Example 5

This example describes a negative-working wet lithographic printing member based on the structure described in Example 1, and a topmost insoluble hydrophilic layer utilizing a fully hydrolyzed PVA polymer (e.g., CELVOL 325) and glyoxal organic crosslinker from Clariant Fine Chemicals. The hydrophilic coating is created using the following polyvinyl alcohol solution:

| Component | Supplier | Parts |
|---|---|---|
| CELVOL 325 | Celanese Chemicals, Ltd. Dallas, TX | 2.50 |
| GLYOXAL | Clariant Fine Chemicals, Charlote, NC | 0.65 |
| BYK333 | BYK-Chemie GmbH, Wesel, Germany | 0.60 |
| Glycerol | Sigma-Aldrich, Saint Louis, MO | 0.17 |
| Water | | 96 |

The fluid is applied on the imaging member using a wire-wound rod, and then dried and cured to produce a solid coating weight of 2 g/m$^2$. The plate images efficiently on different imaging setters, e.g., the Presstek DIMENSION 400 and DIMENSION 425, the Presstek VECTOR TX-52, and the Kodak TRENDSETTER. This printing plate was evaluated on a Heidelberg GTO press using black ink and uncoated paper. The plate was imaged on the DIMENSION 425 plate setter and manually cleaned with a water wet cotton wipe prior to the press work. The plate ran for at least 4,000 impressions with no signs of wear or scratch failure.

Example 6

This example describes a negative-working wet plate similar to that of Example 4 with radiation-responsive and oleophobic layers disposed on a highly scattering polyester base and subsequently laminated to an aluminum coil.

The structure of Example 1 was constructed using a 50 μm MELINEX 928W polyester substrate, and then coated with the 2 g/m$^2$ formulation used in Example 4. The coated structure is then laminated to a 150 μm coil of aluminum 3103 alloy lithographic metal (Alcoa, Pittsburgh, Pa.) using an acrylate adhesive supplied by Dyna-Tech Adhesives & Coatings, Grafton, W.Va. The acrylate adhesive is a 100% solids formulation cured with an e-beam radiation source.

The laminated printing plate was evaluated for imaging and printing performance with the equipment and procedures described on Example 4. The plate exhibits imaging and press performance similar to that of the plate member of Example 4.

Example 7

A negative-working wet printing plate similar to that of Example 6 has a hydrophilic PVA topmost layer crosslinked with the organic GLYOXAL crosslinker (as in Example 5). The laminated plate exhibits imaging and press performance similar to that of the plate member of Example 5.

Although the present invention has been described with reference to specific details, it is not intended that such details should be regarded as limitations upon the scope of the invention, except as and to the extent that they are included in the accompanying claims.

What is claimed is:

1. A printing member comprising:

a) a polymeric substrate;

b) disposed over the substrate, first and second radiation-responsive layers adjacent and in contact with each other and each having a thickness below an optical penetration depth thereof for near-IR radiation, wherein the first radiation-responsive layer consists essentially of a metal having a coefficient of extinction of at least 3 in a wavelength range of 600-1200 nm, and (ii) the second radiation-responsive layer consists essentially of a metal having a transmittance of at least 30% in a wavelength range of 600-1200 nm; and c) a topmost layer disposed over the first and second radiation-responsive layers, the topmost layer and the substrate having opposite affinities for at least one of ink or a liquid to which ink will not adhere.

2. The printing member of claim 1, wherein the second radiation-responsive layer overlies the first radiation-responsive layer.

3. The printing member of claim 1, wherein the first and second radiation-responsive layers have melting points below 1100° C.

4. The printing member of claim 3, wherein the second radiation-responsive layer has a melting point below 500° C.

5. The printing member of claim 1, wherein the substrate scatters imaging radiation and the second radiation-responsive layer reflects imaging radiation.

6. The printing member of claim 1, wherein the first radiation-responsive layer consists essentially of at least one of aluminum, copper, silver or gold.

7. The printing member of claim 1, wherein the second radiation-responsive layer consists essentially of at least one of tin, zinc, indium or gallium.

8. The printing member of claim 1, wherein the first radiation-responsive layer has a thickness ranging from 8 to 16 nm.

9. The printing member of claim 8, wherein the first radiation-responsive layer has a thickness of 12 nm.

10. The printing member of claim 1, wherein the second radiation-responsive layer has a thickness ranging from 4 to 8 nm.

11. The printing member of claim 1, wherein the second radiation-responsive layer has a thickness of 5 nm.

12. The printing member of claim 1, wherein the first and second radiation-responsive layers have a combined thickness ranging from 12 to 24 nm.

13. The printing member of claim 1, wherein the substrate is oleophilic and the topmost layer is polymeric and oleophobic.

14. The printing member of claim 13, wherein the substrate is polyester and the topmost layer is silicone.

15. The printing member of claim 1, wherein the substrate is oleophilic and the topmost layer is polymeric and hydrophilic.

16. The printing member of claim 15, wherein the substrate is polyester and the topmost layer is polyvinyl alcohol.

* * * * *